United States Patent [19]
Frake et al.

[11] Patent Number: 5,764,564
[45] Date of Patent: Jun. 9, 1998

[54] WRITE-ASSISTED MEMORY CELL AND METHOD OF OPERATING SAME

[75] Inventors: Scott O. Frake, Cupertino; Philip D. Costello, San Jose, both of Calif.

[73] Assignee: Xilinx, Inc., San Jose, Calif.

[21] Appl. No.: 814,248

[22] Filed: Mar. 11, 1997

[51] Int. Cl.⁶ .................................................. G11C 11/00
[52] U.S. Cl. .................................... 365/154; 365/156
[58] Field of Search ................................ 365/154, 156

[56] References Cited

U.S. PATENT DOCUMENTS

| | | | |
|---|---|---|---|
| 4,777,623 | 10/1988 | Shimazu et al. | 365/154 |
| 4,821,233 | 4/1989 | Hsieh | 365/154 |
| 5,040,146 | 8/1991 | Mattausch et al. | 365/154 |
| 5,301,147 | 4/1994 | Guo et al. | 365/154 |
| 5,325,325 | 6/1994 | Azuma | 365/154 |

*Primary Examiner*—Son T. Dinh
*Attorney, Agent, or Firm*—E. Eric Hoffman, Esq.; Edel M. Young

[57] ABSTRACT

For a memory cell comprising a latch with cross-coupled inverters and an n-channel access transistor, the inverter that can contend with the access transistor is connected not between power and ground but between power and a transistor that disconnects the inverter from ground when the memory cell is being written. This allows transistors in the memory cell to be small and still function properly, without requiring that a port be provided for the complement of the data signal. The invention is important when there are several write ports to the memory cell and the addressing overhead is significant.

12 Claims, 10 Drawing Sheets

FIG. 4B FUNCTION GENERATOR

FIG. 4C

FIG. 4D FUNCTION GENERATOR

WRITE-ASSISTED MEMORY CELL AND METHOD OF OPERATING SAME

FIELD OF THE INVENTION

The present invention relates to a memory cell architecture and to a method for operating a memory cell. More specifically, the present invention relates to a memory cell having a write assist mechanism for ensuring that write operations to the memory cell are performed reliably.

BACKGROUND OF THE INVENTION

Figure 1:
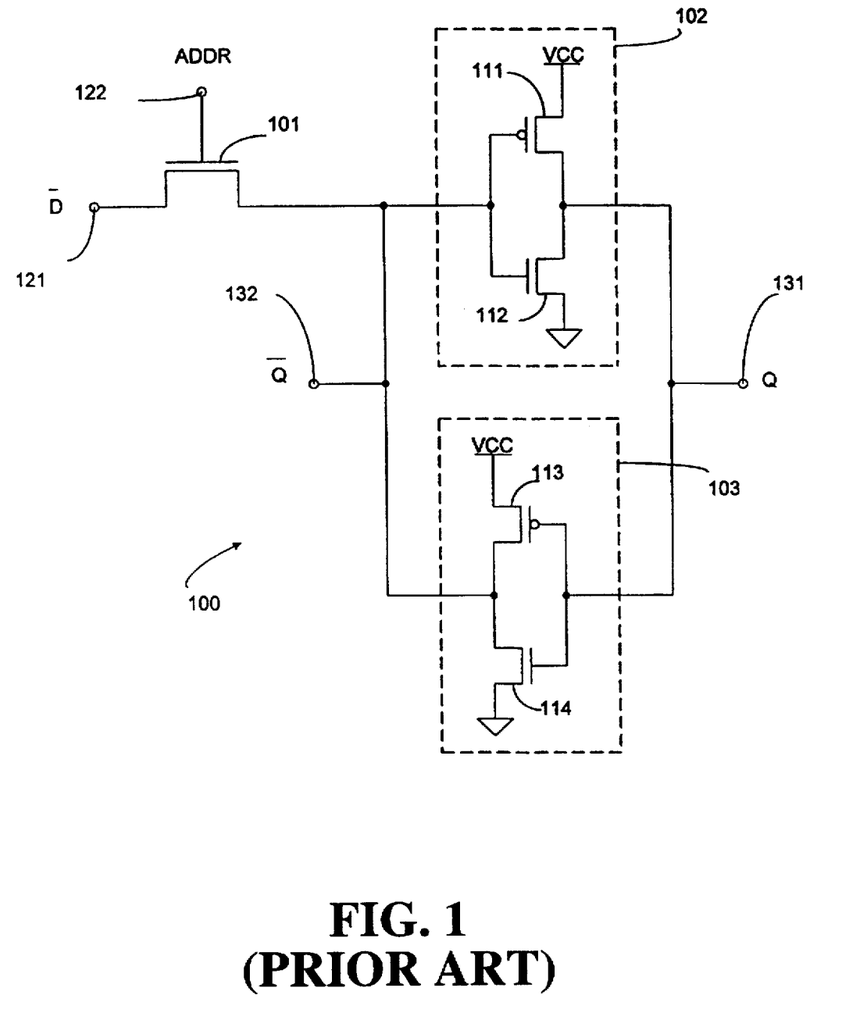
FIG. 1 is a schematic diagram of a conventional five transistor memory cell.

FIG. 1 is a schematic diagram of a conventional five transistor memory cell 100. Memory cells such as memory cell 100 are typically used in field programmable gate arrays (FPGAs) to control the configuration of the FPGA. Memory cell 100 includes n-channel access transistor 101, and inverters 102 and 103. Inverter 102 includes p-channel transistor 111 and n-channel transistor 112. Similarly, inverter 103 includes p-channel transistor 113 and n-channel transistor 114. Inverters 102 and 103 are cross-coupled to form a latch. Inverter 102 provides an output signal Q to output terminal 131, while inverter 103 provides an output signal $\overline{Q}$ (which is the inverse of output signal Q) to output terminal 132. Memory cell 100 can be latched in either a logic low state (Q =logic low, $\overline{Q}$=logic high), or a logic high state (Q=logic high, $\overline{Q}$=logic low). Access transistor 101 receives an input signal $\overline{D}$ on input terminal 121. The gate of access transistor 101 receives a control signal ADDR on input terminal 122. Access transistor 101 is connected to output terminal 132.

Memory cell 100 is programmed by asserting a logic high control signal ADDR on input terminal 122, while controlling the input signal $\overline{D}$ applied to input terminal 121 to have either a logic high voltage level (e.g., Vcc), or a logic low voltage level (e.g., 0 volts.) When the input signal $\overline{D}$ has a logic low voltage level, n-channel transistor 101 will pass a 0-volt signal. A 0-volt signal is adequate to cause memory cell 100 to transition from a logic low state to a logic high state. However, when the input signal $\overline{D}$ has a logic high level, n-channel transistor 101 will pass a signal having a voltage of (Vcc–Vth) volts, where Vth is the threshold voltage of transistor 101.

A signal having a voltage of (Vcc–Vth) may be insufficient to change the state of memory cell 100 from a logic high state to a logic low state. When memory cell 100 is latched in a logic high state, transistors 111 and 114 are turned on (and transistors 112 and 113 are turned off), thereby providing a logic high output voltage at terminal 131 and a logic low output voltage at terminal 132. The voltage (Vcc–Vth) provided by transistor 101 must be able to overcome the pull-down effects of n-channel transistor 114 and raise the voltage on terminal 132 to the trip point of inverter 102 to successfully change the state of memory cell 100. To ensure that the voltage provided through transistor 101 is sufficient to overcome the pull-down effects of n-channel transistor 114, n-channel transistor 114 is intentionally fabricated with a channel region several times as long as the other transistors. This long channel region results in a relatively weak n-channel transistor 114. The voltage (Vcc–Vth) provided through access transistor 101 is thereby able to overcome the pull-down effects of the weak n-channel transistor 114 to change the state of memory cell 100 from a logic high state to a logic low state. However, lengthening the channel region of n-channel transistor 114 undesirably increases the layout area of memory cell 100.

Figure 2:
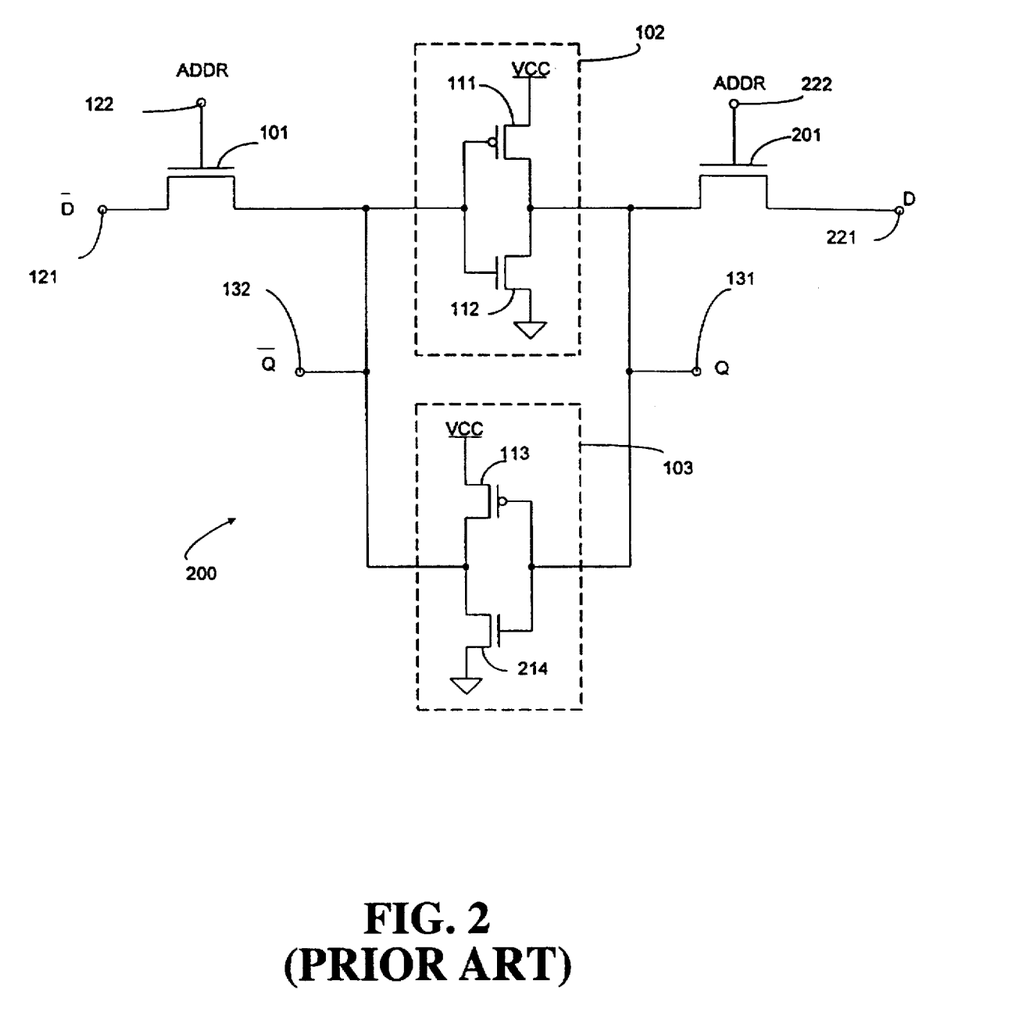
FIG. 2 is a schematic diagram of a conventional six transistor memory cell.

FIG. 2 is a schematic diagram of a conventional six transistor memory cell 200. Memory cell 200 is similar to memory cell 100. Thus, similar elements in memory cells 100 and 200 are labeled with similar reference numbers. In addition to the previously described elements of memory cell 100, memory cell 200 includes a second access transistor 201, which is connected between output terminal 131 and input terminal 221. In addition, the weak n-channel transistor 114 of memory cell 100 is replaced with an n-channel transistor 214 having the same channel length as n-channel transistor 112.

In memory cell 200, the gate electrode of second access transistor 201 is connected to receive the control signal ADDR. When the state of memory cell 200 is to be changed, the control signal ADDR is asserted to turn on both of the access transistors 101 and 201. A logic low voltage is then applied to the drain of one of the transistors 101 and 201, and a logic high voltage is applied to the drain of the other of transistors 101 and 201. Because both of the output terminals 131 and 132 are driven, and because one of the output terminals 131–132 will be pulled down to a logic low voltage (e.g., 0 volts), write operations to memory cell 200 are reliably performed. However, memory cell 200 disadvantageously requires an additional access transistor 201 to form the write port. Also, when memory cell 200 is part of a memory bank accessed through a decoding multiplexer, the entire decoding multiplexer must be repeated for the second port.

As previously described, memory cells 100 and 200 can be used in an FPGA. However, such memory cells are often required to implement more than one function within the FPGA. For each function implemented by the memory cell, a dedicated write port is required. Freeman et al. in U.S. Pat. No. 5,343,406 [docket M-936] describe a memory cell with two write ports, one for receiving a value during configuration of the FPGA and one for receiving a value when the memory cell is being used as part of a RAM. Bauer in commonly assigned copending patent application Serial No. 08/754,421 [docket X-275] describes a set of memory cells usable for three purposes: (1) a lookup table in a function generator, (2) a RAM, and (3) a shift register. The memory cells must each have three ports because data for writing to the memory cells come from three different sources. The structure described by Bauer is shown here in FIG. 3A. The structure of Bauer is a single-ended memory cell because all three ports attach to the same "end" of the memory cell, the end that provides the $\overline{Q}$ output signal.

Figure 3A:
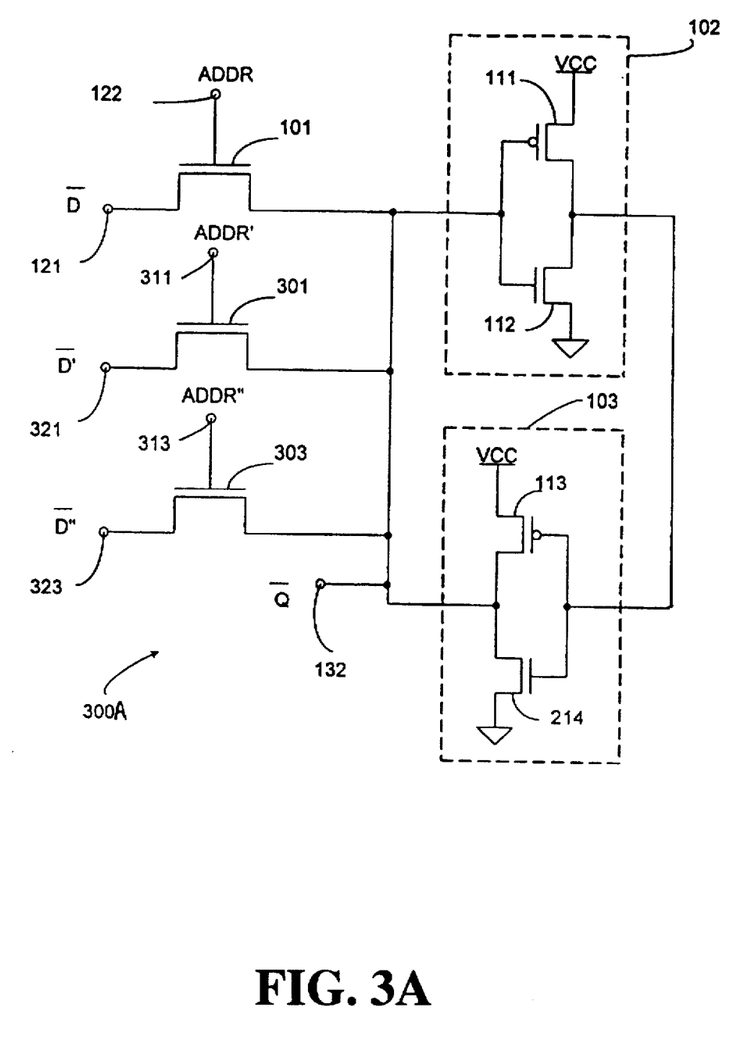
FIG. 3A is a schematic diagram of a single-ended multi-port memory cell.
Figure 3B:
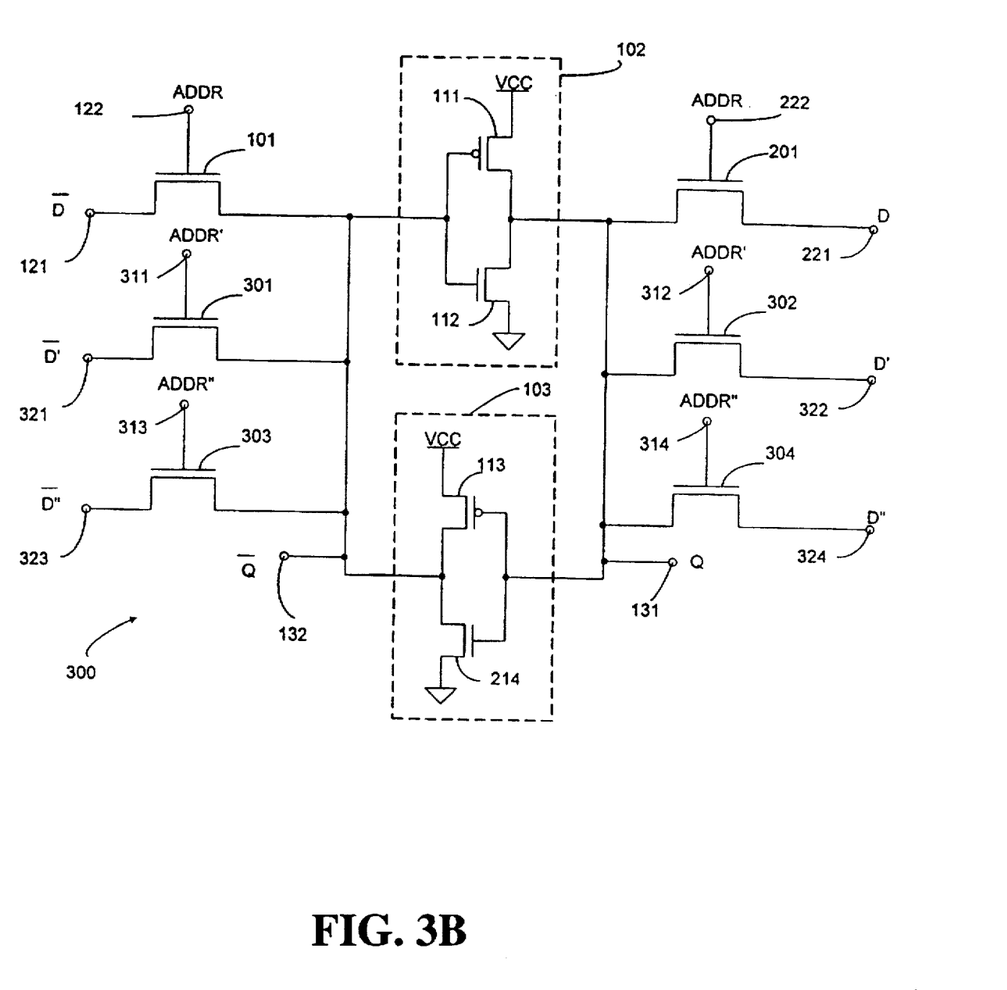
FIG. 3B is a schematic of a double-ended multi-port memory cell.

Similar elements in FIGS. 2, 3A, and 3B are labeled with similar reference numbers. In addition to the elements present in memory cell 200, memory cell 300A includes additional access transistors 301 and 303. Access transistor 301 provides a second write port which enables memory cell 300A to implement a second function, for example a RAM. The second write port is accessed by asserting a control signal ADDR' on input terminal 311 and providing the desired data signal $\overline{D}'$ to input terminal 321. Similarly, access transistor 303 provides a third write port which enables memory cell 300A to implement a third function, for example part of a shift register. The third write port is accessed by asserting a control signal ADDR" on input terminal 313 and providing the desired data signal $\overline{D}"$ to input terminal 323.

Since memory cell 300A is single-ended, transistor 214 in inverter 103 must have a long channel length so that an input signal can successfully override the output signal from inverter 103. It is desirable to minimize the area of the memory cell because it is repeated many times in an FPGA.

FIG. 3B is a schematic diagram of a memory cell 300, which could be used instead of memory cell 300A to achieve the smaller channel length of transistor 214. However, each additional write port added to memory cell 300 requires an additional two transistors. Thus, three-write-port memory cell 300 requires ten transistors.

In addition, memory cell 300 requires additional transistors in associated overhead circuitry such as ancillary decoding circuitry and write logic circuitry. This overhead circuitry can be understood by reviewing FIGS. 4A through 4D.

Figure 4A:
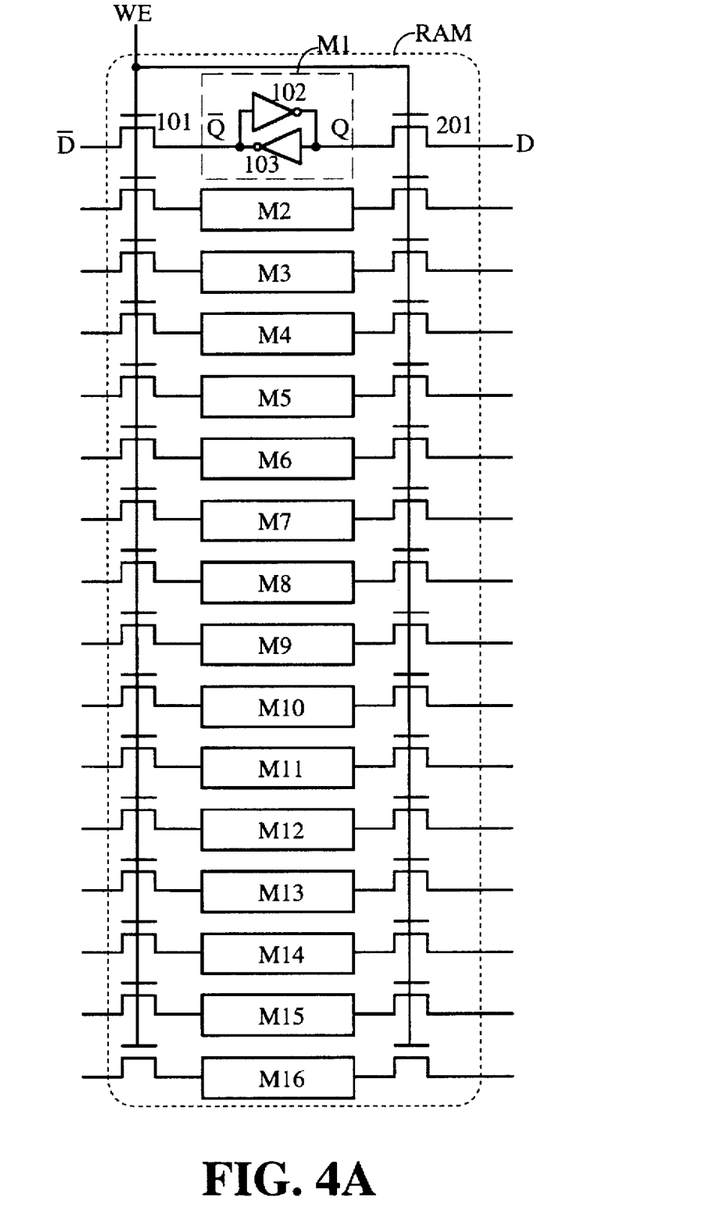
FIG. 4A is a double-ended single-port RAM.
Figure 4B:
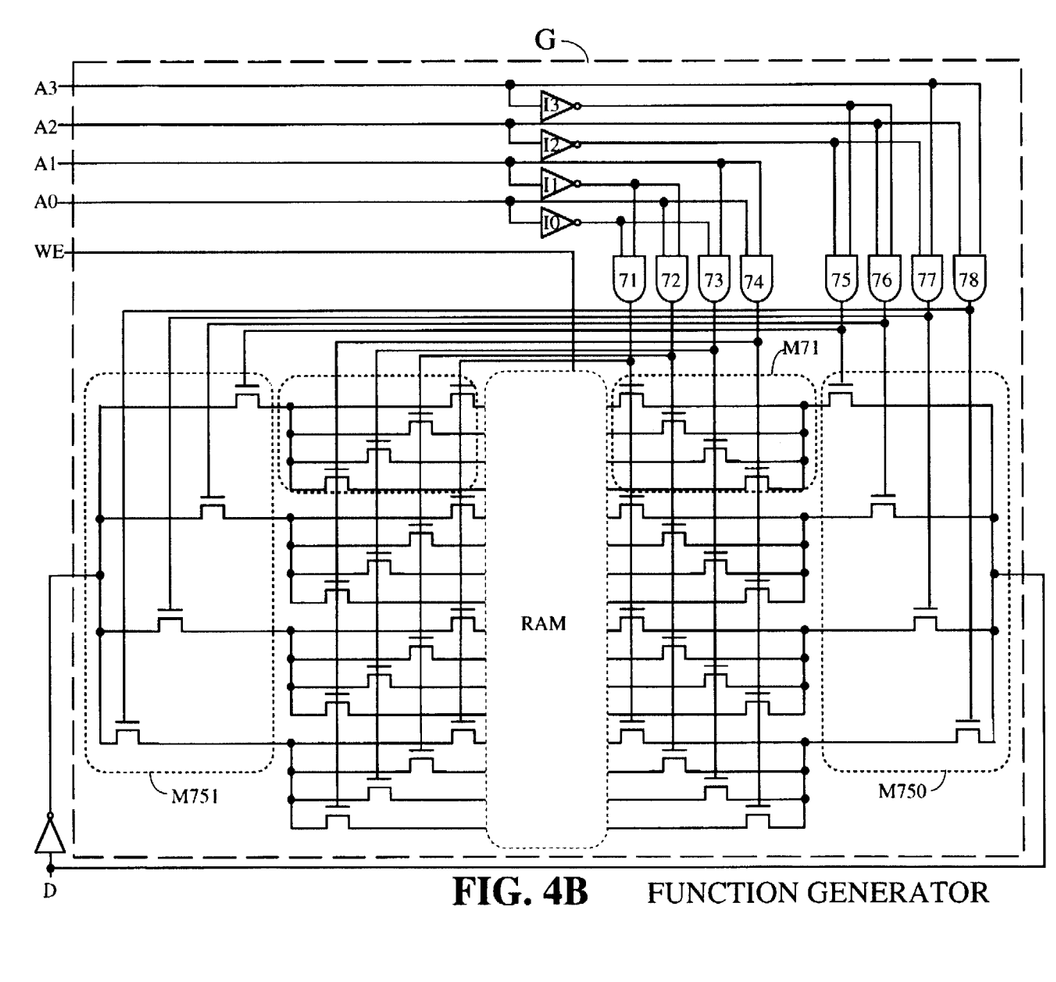
FIG. 4B is a schematic of the decoding overhead for addressing a double ended single-port cell in a RAM.
Figure 4C:
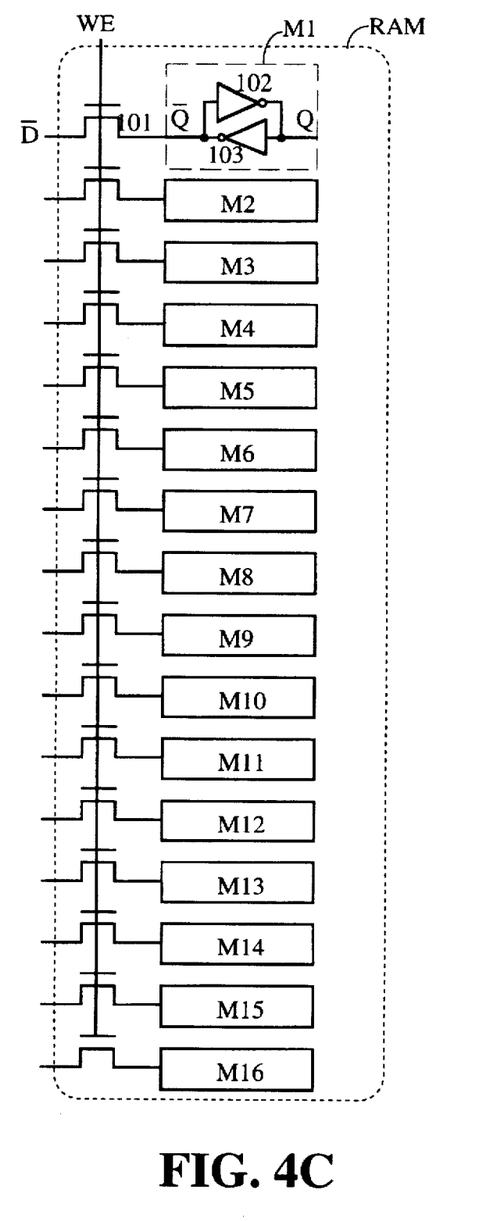
FIG. 4C is a single-ended single-port RAM.
Figure 4D:
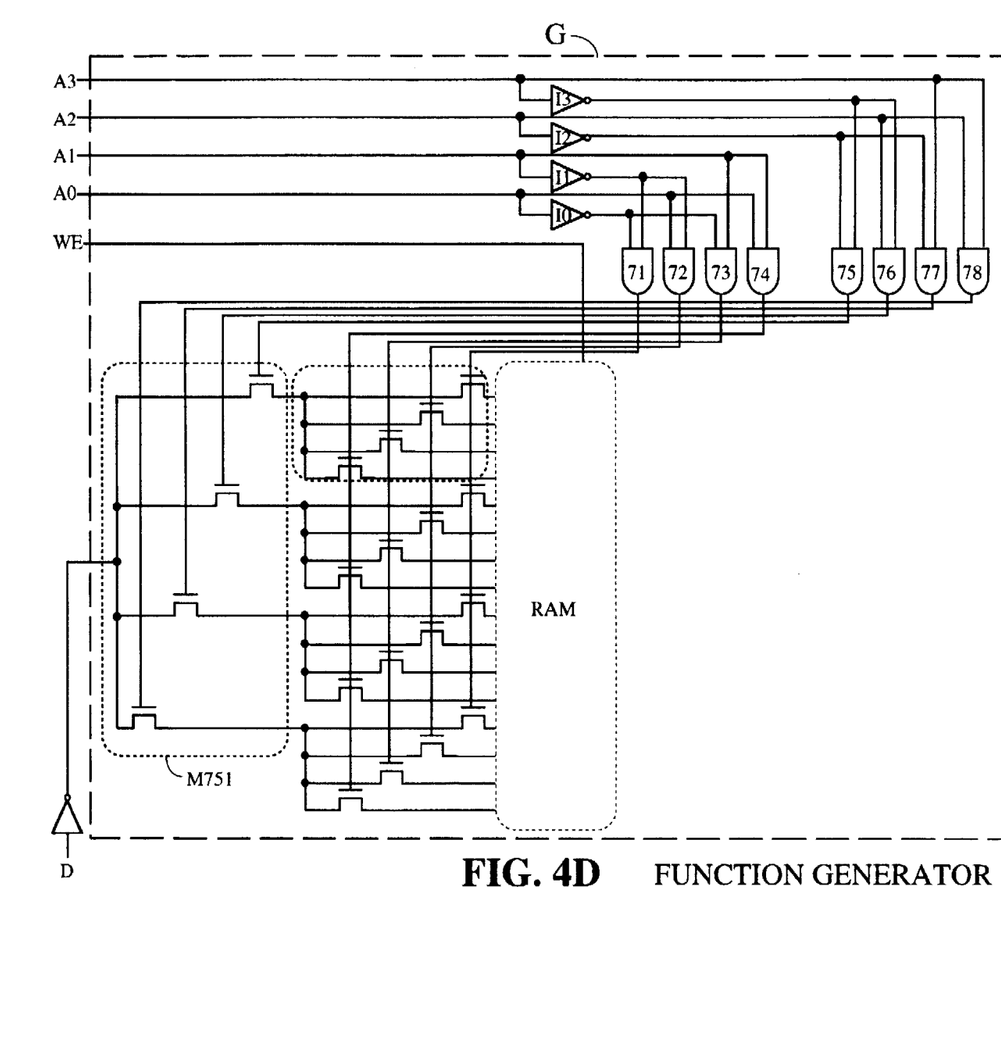
FIG. 4D is a schematic of the decoding overhead for addressing a single ended single-port cell in a RAM.

FIGS. 4A and 4B show the context in which the memory cell of FIG. 1 may be used. FIG. 4A shows a bank of 16 memory cells M1 through M16, each of which is as shown in FIG. 2. Lines earlier labeled ADDR are equivalent to write enable line WE in FIGS. 4A and 4B. FIG. 4B shows the structure for addressing and writing to one of the 16 memory cells of FIG. 4A. AND gates 71 through 78 receive address signals A0 through A3, and their complements provided by inverters I0 through I3. These AND gates control 40 transistors for routing a data signal D into a selected memory cell of the RAM. 20 transistors select the D side of the RAM and 20 transistors select the $\overline{D}$ side of the RAM. Thus a RAM using memory cells such as shown in FIG. 2 requires not only more transistors in the RAM itself but duplicate addressing circuitry for the two sides of the RAM. FIGS. 4C and 4D show the structure that results when a single-ended memory cell of FIG. 1 is used. Not only are there only 20 transistors in the overhead, but AND gates 71 through 78 may be made smaller because only one bank of transistors must be controlled.

If double ended memory cells such as shown in FIG. 2 were used in a situation having three write ports, the structure of FIG. 4B would have to be considerably enlarged in order to provide overhead circuitry for the two additional write ports. This would be a very large and therefore expensive structure. Thus, for RAMs having multiple write ports it is particularly desirable to use single-ended memory cells.

It is desirable to have a single-ended memory cell which minimizes the required number and size of transistors and still enables reliable write operations to be performed.

SUMMARY OF THE INVENTION

Accordingly, the present invention provides a memory cell having an access transistor, a first inverter and a second inverter. The first and second inverters are cross coupled to form a latch. As in the prior art, the latch receives a data signal from the access transistor. As a novel and important feature of the invention, the second inverter includes a switch element which disconnects the second inverter from a first voltage supply during the time that a data signal is being written into the memory cell through the access transistor. Disconnecting the second inverter from the first voltage supply advantageously increases the reliability of the write operation. As another advantage, the switch element can be designed to consume less layout area than the additional layout area consumed by lengthening the channel region of a prior art single ended memory cell. Moreover, the switch element of the second inverter eliminates the need for a second access transistor in the write port of the memory cell, thereby minimizing the number of transistors required in the memory cell and the number of transistors needed to decode addresses and direct a signal to the addressed memory cell.

Only one access transistor is required to provide an additional write port to a memory cell in accordance with the present invention. Thus, a memory cell in accordance with the present invention which has a large number of write ports will require a relatively small area when compared with a double-ended memory cell. Area is saved because overhead circuitry to create and route the complementary data input of the RAM is not required.

In a particular embodiment, the access transistor of the memory cell is an n-channel transistor, which is capable of passing a logic high signal having a voltage of (Vcc–Vth). The switch element disconnects the second inverter from the ground supply voltage during write operations, thereby eliminating the pull-down effect of the second inverter during write operations, and ensuring that an applied voltage of (Vcc–Vth) is sufficient to switch the state of the first inverter.

The present invention also includes a method which includes the steps of: (1) applying a control voltage having a first logic state to an access transistor, thereby turning on the access transistor, (2) routing a data signal having a first logic state through the access transistor to a latch which comprises a first inverter cross coupled with a second inverter, and (3) disconnecting a selected one of the first and second inverters from a first voltage supply while the data signal is routed through the access transistor.

The present invention will be more fully understood in view of the following detailed description taken together with the drawings.

DETAILED DESCRIPTION

Figure 5:
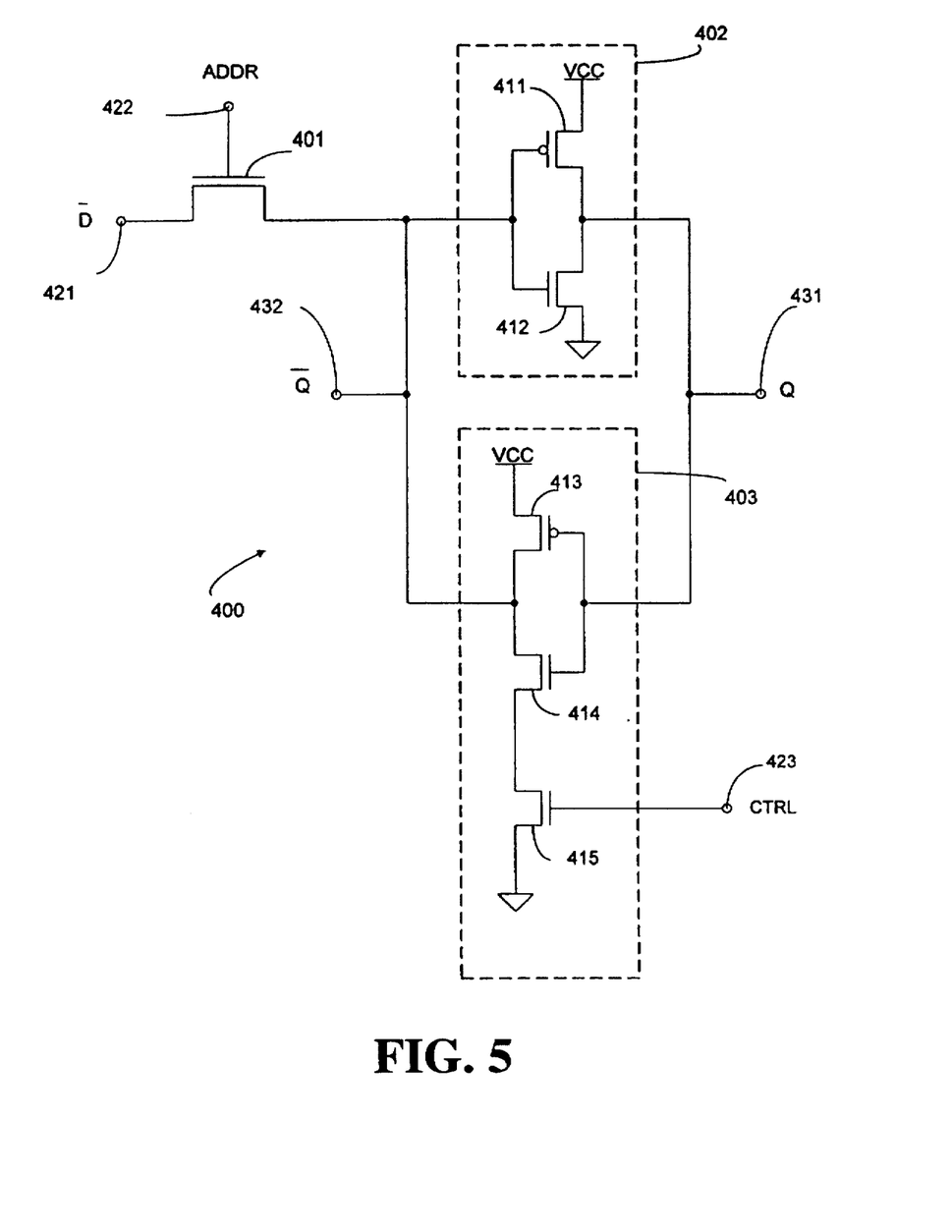
FIG. 5 is a schematic diagram of a single-ended single-port memory cell in accordance with one embodiment of the present invention.

FIG. 5 is a schematic diagram of a single-ended single-port memory cell 400 in accordance with one embodiment of the invention. Memory cell 400 includes n-channel access transistor 401, and inverters 402 and 403. Inverter 402 includes p-channel transistor 411 and n-channel transistor 412, which are connected between a Vcc voltage supply rail and a ground voltage supply rail as illustrated. In the described embodiment, the Vcc voltage supply rail is held at a voltage of approximately 5 volts, while the ground voltage supply rail is held at a voltage of approximately 0 volts. However, the use of other voltages is possible, and considered to be within the scope of the invention. The input terminal of inverter 402 is connected to output terminal 432, and the output terminal of inverter 402 is connected to output terminal 431.

Inverter 403 includes p-channel transistor 413 and n-channel transistors 414 and 415, which are connected between the Vcc and ground voltage supply rails as illustrated. The output terminal of inverter 403 is connected to output terminal 432, while the input terminal of inverter 403 is connected to output terminal 431. Thus, inverters 402 and 403 are cross-coupled to form a latch. Inverter 402 provides an output signal Q to output terminal 431, while inverter 403 provides an output signal $\overline{Q}$ (which is the inverse of output signal Q) to output terminal 432. Memory cell 400 can be in either a logic low state (Q=logic low, $\overline{Q}$=logic high) or a logic high state (Q=logic high, $\overline{Q}$=logic low).

Within inverter 403, p-channel transistor 413 and n-channel transistor 414 are connected in a conventional inverter configuration. N-channel transistor 415 is connected between n-channel transistor 414 and the ground voltage supply rail. As described in more detail below, n-channel transistor 415 operates as a switch which disconnects inverter 403 from the ground voltage supply rail during write operations. Unlike n-channel transistor 114 of memory cell 100 (FIG. 1), neither n-channel transistor 414 nor n-channel transistor 415 requires an unusually long channel region. The channel regions may be the minimum allowed by the process technology. As a result, n-channel transistors 414 and 415 combined require a smaller layout area than n-channel transistor 104.

The gate electrode of n-channel transistor 415 is connected to receive a control signal CTRL. As described in more detail below, the control signal CTRL is de-asserted during a write operation to memory cell 400. The de-asserted control signal CTRL causes n-channel transistor 415 to turn off, thereby de-coupling n-channel transistor 414 from the ground voltage supply rail during a write operation to memory cell 400. Decoupling the n-channel transistor 414 from the ground voltage supply rail enables memory cell 400 to change states reliably.

The drain of access transistor 401 is connected to receive an input signal $\overline{D}$ on input terminal 421. The gate of access transistor 401 is connected to receive a control signal ADDR on input terminal 422. The source of access transistor 401 is connected to output terminal 432. Access transistor 401 defines a write port of memory cell 400.

Data values are written to memory cell 400 as follows. A logic high control signal ADDR is asserted on input terminal 422, thereby turning on access transistor 401. At the same time or after a slight delay, the control signal CTRL is de-asserted at a logic low level, thereby turning off transistor 415. In one embodiment of the invention, the control signal CTRL is generated by routing the control signal ADDR through an inverter (not shown). (This inverter does not significantly increase area because one inverter can provide the control signal for many memory cells.) In another embodiment, the control signals ADDR and CTRL are independently generated within external control circuitry (not shown).

The desired input signal $\overline{D}$ is applied to input terminal 421. Input signal $\overline{D}$ is given a logic high voltage level (e.g., Vcc or 5 volts) to cause memory cell 400 to enter a logic low state. Conversely, input signal $\overline{D}$ is given a logic low voltage level (e.g., 0 volts) to cause memory cell 400 to enter a logic high state.

When the input signal $\overline{D}$ has a logic low voltage level, n-channel transistor 401 passes a 0-volt signal to the input terminal of inverter 402. As a result, n-channel transistor 412 is turned off, and p-channel transistor 411 is turned on, thereby coupling the output terminal 431 to the Vcc voltage supply rail. Pulling output terminal 431 up to the Vcc supply voltage causes p-channel transistor 413 to turn off. However, at this time, the de-asserted control signal CTRL causes n-channel transistor 415 to be turned off. As a result, n-channel transistor 414 does not couple terminal 432 to the ground voltage supply rail at this time.

After p-channel transistor 411 has turned on, the control signal ADDR is de-asserted, thereby turning off n-channel transistor 401. At substantially the same time, the control signal CTRL is asserted, thereby turning on n-channel transistor 415. When transistor 415 is turned on, output terminal 432 is connected to the ground voltage supply rail through n-channel transistors 414 and 415. The ground supply voltage applied to output terminal 432 causes p-channel transistor 411 to remain turned on. As a result, memory cell 400 is latched in a logic high state.

Memory cell 400 can be latched in a logic low state in the following manner. A logic high control signal ADDR is asserted on input terminal 422, thereby turning on access transistor 401. At the same time, the control signal CTRL is de-asserted at a logic low level, thereby turning off n-channel transistor 415.

When a logic high input signal $\overline{D}$ is applied to input terminal 421, n-channel transistor 401 passes a signal to the input terminal of inverter 402 which has a voltage of (Vcc−Vth), where Vth is the threshold voltage of n-channel transistor 401. Since transistor 415 is off, no pull-down is provided by inverter 403, and the voltage (Vcc−Vth) is sufficient that p-channel transistor 411 is turned off, and n-channel transistor 412 is turned on, thereby coupling the output terminal 431 to the ground voltage supply rail. Because n-channel transistor 415 is turned off by the control signal CTRL, output terminal 432 is not connected to the ground voltage supply rail through transistors 414 and 415. Because the signal passed by access transistor 401 (i.e., Vcc−Vth) does not have to overcome any pull-down effects introduced by inverter 403, it is relatively easy for this signal to turn on n-channel transistor 412.

Pulling output terminal 431 to ground causes p-channel transistor 413 to turn on, and causes n-channel transistor 414 to turn off. As a result, output terminal 432 is connected to the Vcc voltage supply rail through turned on p-channel transistor 413.

After n-channel transistor 412 and p-channel transistor 413 have been turned on, the control signal ADDR is de-asserted, thereby turning off n-channel transistor 401. After memory cell 400 has latched the new data, the control signal CTRL is asserted, thereby turning on n-channel transistor 415. As a result, memory cell 400 is latched in a logic high state, and is ready to provide an output signal at Q.

Figure 6:
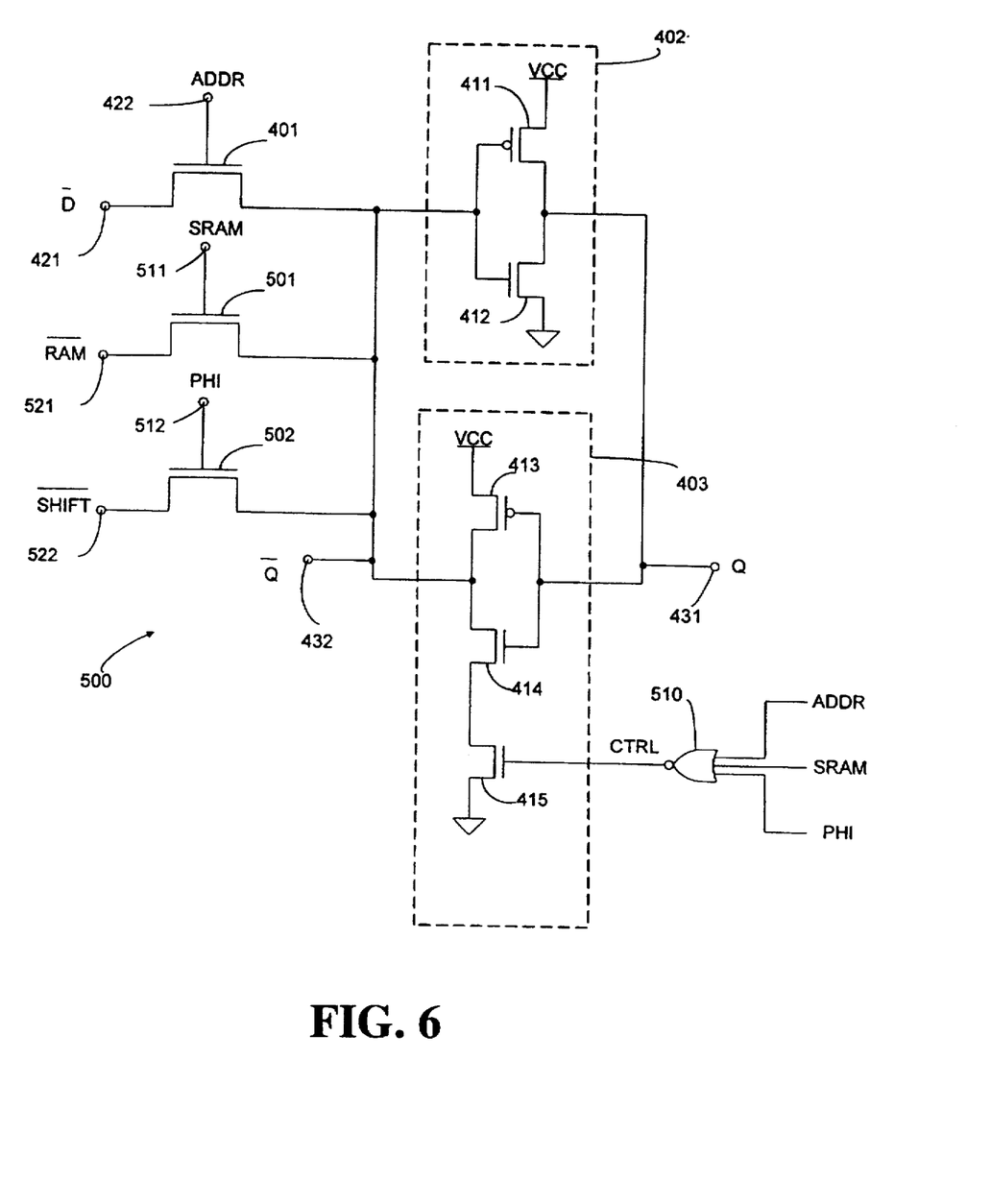
FIG. 6 is a schematic diagram of a single-ended multi-port memory cell in accordance with another embodiment of the present invention.

FIG. 6 is a schematic diagram of a multi-port memory cell 500 in accordance with one variation of the present invention. Similar elements in memory cell 500 and memory cell 400 (FIG. 5) are labeled with similar reference numbers. In addition to the previously described elements of memory cell 400, memory cell 500 includes n-channel access transistors 501 and 502. Access transistors 401, 501 and 502 define three separate write ports of memory cell 500. Each of access transistors 401, 501 and 502 is used to implement a different function. When these functions include accessing individual memory cells through a decoding structure such as shown in FIG. 4D, the six transistor memory cell of the invention is advantageous over a double-ended six transistor memory cell because duplicate decoding structures such as shown in FIG. 4B are not needed.

In one embodiment, access transistor 501 is used to provide access to the latch of memory cell 500 when memory cell 500 is used as a look-up table RAM cell. Memory cell 500 is accessed by asserting a logic high control signal SRAM on input terminal 511, and applying a data value $\overline{\text{RAM}}$ to input terminal 521. When memory cell 500 is used as a look-up table RAM cell, data values are written to memory cell 500 through access transistor 501, and read from memory cell 500 through output terminal 431 or output terminal 432. An FPGA look-up table RAM is described in more detail by Freeman et al. in commonly owned U.S. Pat. No. 5,343,406, which is hereby incorporated by reference in its entirety.

In this embodiment, access transistor 502 is used to provide access to the latch of memory cell 500 when memory cell 500 is used in a shift register application. Memory cell 500 is accessed by asserting a logic high control signal PHI on input terminal 512, and applying a data value $\overline{\text{SHIFT}}$ to input terminal 522. When memory cell 500 is used in a shift register configuration, data values are shifted into memory cell 500 through access memory cell 500 and shifted out of memory cell 500 through output terminal 431 or output terminal 432. A shift register application is described in more detail by Bauer in commonly owned U.S. patent application Ser. No. 08/754,421 filed Nov. 22, 1996, which is hereby incorporated by reference in its entirety.

In the described embodiment, the control signal CTRL is provided by a 3-input NOR gate 510 (which may control more than one memory cell 500). NOR gate 510 receives the control signals ADDR, SRAM and PHI. If any one of these control signals is asserted in a logic high condition, then the control signal CTRL is de-asserted low, thereby turning off n-channel transistor 415. Operation of memory cell 500 is similar to the previously described operation of memory cell 400 (FIG. 5).

Memory cell 500, which includes three separate write ports, is implemented using eight transistors. This is an improvement over conventional memory cell 300 (FIG. 3), which requires ten transistors to provide a memory cell having the same number of write ports. More importantly, when one port requires a multiplexing structure for addressing the memory cell as part of a RAM and one port requires a shifting structure for implementing a shift register of which the memory cell is a part, the invention achieves a significant area advantage because the multiplexing and shifting structures do not have to be duplicated.

Although the invention has been described in connection with several embodiments, it is understood that this invention is not limited to the embodiments disclosed, but is capable of various modifications which would be apparent to one of ordinary skill in the art. For example, although the present invention has been described as being implemented within a field programmable gate array (FPGA), the present invention is applicable to other devices which utilize memory cells. In addition, it is understood that the conductivity types of the various transistors can be reversed in other embodiments of the invention. Thus, the invention is limited only by the following claims.

We claim:

1. A memory cell comprising:

a first access transistor for receiving a data signal to be written to the memory cell, wherein the first access transistor forms a first write port of the memory cell;

a first inverter having an input terminal connected to the first access transistor, and an output terminal connected to an output terminal of the memory cell; and a second inverter having an input terminal connected to the output terminal of the memory cell, and an output terminal connected to the first access transistor, the second inverter comprising a switch element for disconnecting the second inverter from a first voltage supply when a data signal is being written to the memory cell.

2. The memory cell of claim 1, wherein the first access transistor is an n-channel field effect transistor.

3. The memory cell of claim 1, wherein the second inverter comprises:

a first n-channel transistor connected to the first voltage supply, wherein the first n-channel transistor corresponds with the switch;

a second n-channel transistor connected between the first n-channel transistor and the first access transistor; and a p-channel transistor connected between a second voltage supply and the first access transistor.

4. The memory cell of claim 1, further comprising a second access transistor for receiving a data signal to be written to the memory cell, wherein the second access transistor has a terminal which is connected to the input terminal of the first inverter and the output terminal of the second inverter, the second access transistor forming a second write port of the memory cell.

5. The memory cell of claim 4, further comprising a third access transistor for receiving a data signal to be written to the memory cell, wherein the third access transistor has a terminal which is connected to the input terminal of the first inverter and the output terminal of the second inverter, the third access transistor forming a third write port of the memory cell.

6. The memory cell of claim 1, wherein the first access transistor and the switch are controlled by the same control signal.

7. The memory cell of claim 6, wherein the first access transistor is connected to receive the control signal, and the switch is connected to receive the inverse of the control signal.

8. A method of operating a memory cell comprising first and second inverters connected into a loop and an access transistor driven by said second inverter, the method comprising the steps of:

turning on said access transistor;

disconnecting said second inverter from a power supply terminal;

routing a signal through said access transistor to said first inverter, thereby determining the output state of said first inverter;

reconnecting said second inverter to said power supply terminal; and turning off said access transistor.

9. The method of claim 8 where the steps of turning on and disconnecting occur in the order stated.

10. The method of claim 8 where the steps of turning on and disconnecting occur in an order opposite to that stated.

11. The method of claim 8 where the steps of reconnecting and turning off occur in the order stated.

12. The method of claim 8 where the steps of reconnecting and turning off occur in an order opposite to that stated.

* * * * *